US009627854B2

(12) United States Patent
Gerlach et al.

(10) Patent No.: US 9,627,854 B2
(45) Date of Patent: Apr. 18, 2017

(54) VCSEL WITH INTRACAVITY CONTACTS

(71) Applicant: KONINKLIJKE PHILIPS N.V., Eindhoven (NL)

(72) Inventors: Philipp Henning Gerlach, Aachen (DE); Alexander Weigl, Bubesheim (DE); Christian Wimmer, Ulm (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 14/413,017

(22) PCT Filed: Jul. 1, 2013

(86) PCT No.: PCT/IB2013/055381
§ 371 (c)(1),
(2) Date: Jan. 6, 2015

(87) PCT Pub. No.: WO2014/009843
PCT Pub. Date: Jan. 16, 2014

(65) Prior Publication Data
US 2015/0139260 A1 May 21, 2015

Related U.S. Application Data

(60) Provisional application No. 61/670,167, filed on Jul. 11, 2012.

(51) Int. Cl.
*H01S 5/183* (2006.01)
*H01S 5/42* (2006.01)
(Continued)

(52) U.S. Cl.
CPC .......... *H01S 5/187* (2013.01); *H01S 5/18341* (2013.01); *H01S 5/18372* (2013.01);
(Continued)

(58) Field of Classification Search
CPC ............. H01S 5/18341; H01S 5/18344; H01S 5/18347; H01S 5/1835; H01S 5/18316; H01S 5/18338; H01S 5/4018; H01S 5/423
See application file for complete search history.

(56) References Cited

U.S. PATENT DOCUMENTS 4,943,970 A * 7/1990 Bradley .................... 372/50.124
6,266,357 B1 7/2001 Feld et al.
(Continued)

OTHER PUBLICATIONS

"Electrically-Pumped Vertical-Cavity Lasers With ALXOY—GAAS Reflectors" MacDougal et al, IEEE Photonics Technology Letters Mar. 8, 1996 No. 3, New York, NY.

*Primary Examiner* — Marcia Golub-Miller (57) ABSTRACT

The present invention relates to a laser device being formed of at least one VCSEL (15) with intracavity contacts. The VCSEL comprises a layer structure (18) with an active region (6) between a first DBR (4) and a second DBR (10), a first current-injection layer (5) of a first conductivity type between the first DBR (4) and the active region (6), and a second current-injection layer (8) of a second conductivity type between the second DBR (10) and the active region (6). The first and second current-injection layers (5, 8) are in contact with a first and a second metallic contact (11, 12), respectively. The first and/or second DBR (4, 10) are formed of alternating Aluminum oxide and $Al(x)Ga(1-x)As$ containing layers. The proposed design of this VCSEL allows an increased efficiency and lower production costs of such a laser since the top and bottom DBRs may be formed of a considerable reduced thickness.

10 Claims, 7 Drawing Sheets

(51) Int. Cl.
*H01S 5/187* (2006.01)
*H01S 5/30* (2006.01)
*H01S 5/40* (2006.01)
H01S 5/02 (2006.01)
H01S 5/022 (2006.01)
H01S 5/042 (2006.01)

(52) U.S. Cl.
CPC ............ *H01S 5/305* (2013.01); *H01S 5/4018* (2013.01); *H01S 5/423* (2013.01); H01S 5/0217 (2013.01); H01S 5/0224 (2013.01); H01S 5/0425 (2013.01); H01S 5/18311 (2013.01); H01S 5/18347 (2013.01); H01S 5/18358 (2013.01)

(56) References Cited

U.S. PATENT DOCUMENTS

| | | |
|---|---|---|
| 6,782,021 B2 | 8/2004 | Huang et al. |
| 2002/0150135 A1 | 10/2002 | Naone et al. |
| 2011/0086452 A1 | 4/2011 | Johnson |
| 2011/0274131 A1 | 11/2011 | Takaki et al. |

\* cited by examiner

VCSEL WITH INTRACAVITY CONTACTS

CROSS-REFERENCE TO PRIOR APPLICATIONS

This application is the U.S. National Phase application under 35 U.S.C. §371 of International Application No. PCT/IB2013/055381, filed on Jul. 1, 2013, which claims the benefit of U.S. Patent Application No. 61/670167, filed on Jul. 11, 2012. These applications are hereby incorporated by reference herein.

FIELD OF THE INVENTION

The present invention relates to a laser device being formed of at least one vertical cavity surface emitting laser (VCSEL) with intracavity contacts, said VCSEL comprising a layer structure with an active region between a first distributed Bragg reflector (DBR) and a second distributed Bragg reflector, a first current-injection layer of a first conductivity type between the first distributed Bragg reflector and the active region, and a second current-injection layer of a second conductivity type between the second distributed Bragg reflector and the active region, said first and second current-injection layers being in contact with a first and a second metallic contact, respectively.

BACKGROUND OF THE INVENTION

Commercially available state of the art VCSELs suffer from too low power conversion efficiency so that competition with high power laser bars is difficult. Although the production costs for VCSEL arrays are relatively low, the fraction cost per output power is in tight competition with conventional light sources.

US 2011/0086452 A1 proposes a VCSEL with intracavity contacts to improve the efficiency of the laser. The provision of intracavity contacts allows realising the top and bottom DBR mirrors with an undoped layer structure minimizing free carrier absorption and trap related absorption in these mirrors. This reduction of absorption losses increases the efficiency of the laser. Doped current-injection layers are arranged between the DBRs and the active region and are contacted by appropriately arranged metallic contacts. The doping of the current-injection layers varies in the direction of the optical axis of the laser to form several highly doped regions between lower doped regions or regions without doping. The higher doped regions are arranged in minima of the standing electrical field of the laser radiation oscillating in the laser resonator. This reduces optical absorption losses caused by the doping of the current-injection layers. The top and bottom DBRs are formed of alternating layers of GaAs and AlGaAs. Alternatively alternating layers of GaAs and AlAs are proposed.

SUMMARY OF THE INVENTION

It is an object of the present invention to provide VCSELs with intracavity contacts which allow a further improved efficiency and can be manufactured with low costs.

The object is achieved with the laser device according to claims 1 and 10. Advantageous embodiments of this laser device are subject matter of the dependent claims or are described in the subsequent portions of the description and preferred embodiments.

The proposed laser device is formed of at least one VCSEL with intracavity contacts. The VCSEL comprises a layer structure with an active region between a first DBR and a second DBR, a first current-injection layer of a first conductivity type between the first DBR and the active region, and a second current-injection layer of a second conductivity type between the second DBR and the active region. The first and second current-injection layers are in contact with a first and a second metallic contact, respectively, in order to allow current injection into the active region through the two current-injection layers. The first and/or the second DBR of the proposed VCSEL are formed of alternating Aluminum oxide and $Al(x)Ga(1-x)As$ containing layers, wherein $0 \leq x \leq 0.3$.

In an alternative embodiment the laser device is formed of at least one vertical cavity surface emitting laser with only one intracavity contact. This vertical cavity surface emitting laser comprises a layer structure with an active region between a lower mirror and an upper mirror on a semiconductor substrate, and with a current-injection layer between the upper mirror and the active region. The current injection layer is in contact with a metallic contact. The upper mirror is a distributed Bagg reflector, in the following also called second DBR, which is formed of alternating Aluminum oxide and $Al(x)Ga(1-x)As$ containing layers with $0 \leq x \leq 0.3$. The lower mirror, i.e. the mirror which is arranged closer to the semiconductor substrate, is formed of electrically conducting semiconductor material and thus forms the second contact for the active region.

This design of the first and/or second DBR, forming the end mirrors of the laser cavity of the VCSEL, in connection with the intracavity contacts allows a further reduction of absorption losses and thus an increase in laser efficiency. Due to the high difference of the indices of refraction of Aluminum oxide and the above $Al(x)Ga(1-x)As$ containing layers of the DBR(s), a mirror with a high reflectivity of e.g. 99.9% can be realized already with a number of less than 10 layer pairs compared to e.g. a DBR with alternating GaAs and AlAs layers requiring a number of approximately 30 layer pairs to achieve such a high reflection. The DBR(s) of the proposed VCSEL can thus be realized with a significantly reduced thickness which safes material and production costs and due to the reduced thickness exhibits reduced optical losses. The Aluminum oxide layers can be formed by oxidizing a layer structure of alternating AlAs and GaAs layers. The oxidation process can be performed in the same step as the oxidation of the current aperture layer which preferably is also provided in the proposed VCSEL between one of the current-injection layers and the active region. Due to the different thicknesses of the current aperture layer, preferably made from AlAs, and the AlAs layers of the layer structure for the DBR, full oxidation of the DBR AlAs layers can be achieved while the current aperture layer is only oxidized to achieve the desired current aperture. Instead of AlAs layers also $Al(x)Ga(1-x)As$ layers with $x \approx 0.98$ can be used. The oxidation rate of the current aperture can also additionally be adjusted by including fractions of other materials in the layer in order to reduce the oxidation rate.

The layer structure for the proposed VCSEL is preferably epitaxially grown on an appropriate substrate, like a GaAs substrate. The epitaxially grown layer sequence is subsequently structured by appropriate masking and etching processes in order to be able to apply the metallic contacts for the current-injection layers and to allow oxidation of the above layers through an oxidation process. The skilled person knows appropriate masking, etching and lift-off processes from the field of VCSEL fabrication. The same applies to the doping processes for the current-injection layers, in particular for a periodically varying doping of the current-injection layers. Such processes are e.g. also known from the above US patent application and the further documents cited therein.

Due to the oxide layers in case of both DBRs being formed according to the above design, the proposed VCSELs can be easily serially connected on a substrate. The oxide layers in the DBRs allow the application of higher voltages compared to conventional VCSELs without such oxide layers and may also be serially connected to enable an operation of the serially connected VCSELs with a tension of 230V. The metallic contacts for the current-injection layers are preferably arranged on opposing sides of each VCSEL such that facing contacts of adjacent VCSELs may be easily electrical connected to one another to form the series connection. The above mentioned opposing sides are not the sides of the DBRs, but the lateral sides with respect to the optical axis of the VCSEL.

In another embodiment in which the proposed VCSELs are arranged side by side, a metallization structure, in particular forming at least two contact pads, is applied on one side of this VCSEL array. The contact or solder pads and corresponding metallic connections to the metallic contacts of the VCSELs are realized as a sufficiently thick structure to provide a mechanical stabilization of this VCSEL array without any supporting substrate. The substrate on which the individual VCSEL layer structures are grown can thus be lifted off after the fabrication of the VCSELs. In this embodiment, the DBRs facing the substrate are designed as the outcoupling mirrors, whereas the opposing DBRs are designed to provide the highest reflectivity (bottom emitting VCSEL). Such a VCSEL arrangement can be realized as a SMD like package (SMD: surface mounted device), so that these devices can be handled and mounted like other SMD components of the prior art. This does not require any further packing step, since the above devices can be directly dimensioned and designed already on wafer level to the desired size. The removing of the substrate has the further advantage that such a VCSEL array comprises an extremely small amount of banned substances (Arsenides) only, thus fulfilling requirements for helping to safe the environment and reduce pollution.

The proposed VCSEL design allows a significant reduction of epitaxial layer thickness and complexity in epitaxial design compared with state of the art VCSELs. The lower absorption losses in the DBR mirrors result in an increased efficiency of the laser. Epitaxial designs for the proposed VCSEL are well suited to be grown with MBE reactors (MBE: molecular beam epitaxie) as hard interfaces and almost no gradual layers are needed.

BRIEF DESCRIPTION OF THE DRAWINGS

The proposed VCSEL is described in the following by way of examples in connection with the accompanying figures without limiting the scope of protection as defined by the claims. The figures show:

DETAILED DESCRIPTION OF EMBODIMENTS

Figure 1:
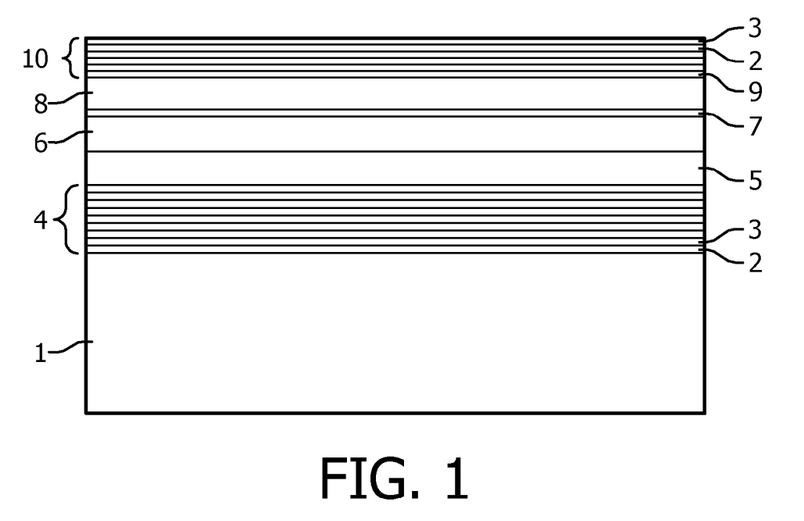
FIG. 1 an example of the epitaxial layer structure used to form the proposed VCSEL.

FIG. 1 schematically shows an example of an epitaxial layer structure for forming a proposed VCSEL as a top emitter. The epitaxial layer design starts with pairs of AlAs/Al(x)Ga(1−x)As layers (0≤x≤0.3) on a GaAs substrate 1. The combination of AlAs-layers 2 with the Al(x)Ga(1−x)As layers, for example GaAs-layers 3, gives a high contrast DBR with high reflectivity after converting the AlAs-layers 2 from AlAs to Aluminum oxide. For short wavelength VCSELs, the GaAs-layers should be exchanged by some AlGaAs-layers to avoid fundamental absorption in the mirrors. In order to achieve a high reflectivity, eight pairs of AlAs/GaAs-layers are used in this example.

On top of this bottom DBR 4 a Si-doped spacer region is arranged forming the n-current-injection layer 5. The doping profile periodically varies in the direction of the optical axis of the VCSEL which is perpendicular to the layers and substrate 1. The variation is such that higher doping concentrations are situated in minima of the electrical field in the standing wave pattern of optical radiation resonating in the VCSEL cavity. On top of the n-current-injection layer 5 the active region 6 is formed of a few quantum wells, similar to conventional VCSEL designs. There follows a thin AlAs layer 7 to be oxidized and to form the current/optical mode aperture. This is also similar to conventional VCSELs. A C-doped spacer layer is arranged on top of the AlAs layer 7 to get the lateral p-type charge carriers injected into the active region 6. This spacer layer forms the p-current-injection layer 8 of the VCSEL. In order to avoid optical losses the heavy doping of this layer is only applied in the nodes of the standing wave pattern. This results in a periodic structure with thin regions with a thickness of approximately 10 nm only, which are highly doped, i.e. having a doping concentration with C-atoms of $\geq 1*10^{20}$ cm$^{-3}$. The remaining material remains undoped or has only very little amount of doping. On top of the topmost highly doped region of the p-current-injection layer 8 a thin etch stop layer 9 is formed from 30 monolayers of AlAs. This is needed to get access to the topmost highly doped region of the p-current-injection layer 8 during processing in order to make the electrical (metallic) contact. The epitaxial layers end with a few pairs of AlAs/GaAs-layers, usually 3 or 4, which after the oxidation step at the end of the processing form the top DBR 10, i.e. the outcoupling mirror of the VCSEL in the present example of a top emitting VCSEL. The overall thickness of the epitaxial layer sequence is approximately 3 μm only. The doping concentration in the highly doped regions of the p-current-injection layer are between $1*10^{19}$ and $1*10^{21}$ cm$^3$, in the n-current-injection layer between $1*10^{18}$ and $4*10^{18}$ cm$^3$.

This layer sequence of FIG. 1 is processed in order to get the desired layer structure forming the proposed VCSEL. Different process steps are schematically indicated in FIGS. 2a to 2i. Typically, a high number of VCSELs are fabricated on wafer level by structuring a corresponding epitaxial layer sequence according to FIG. 1 extending over the whole wafer.

Figure 2A:
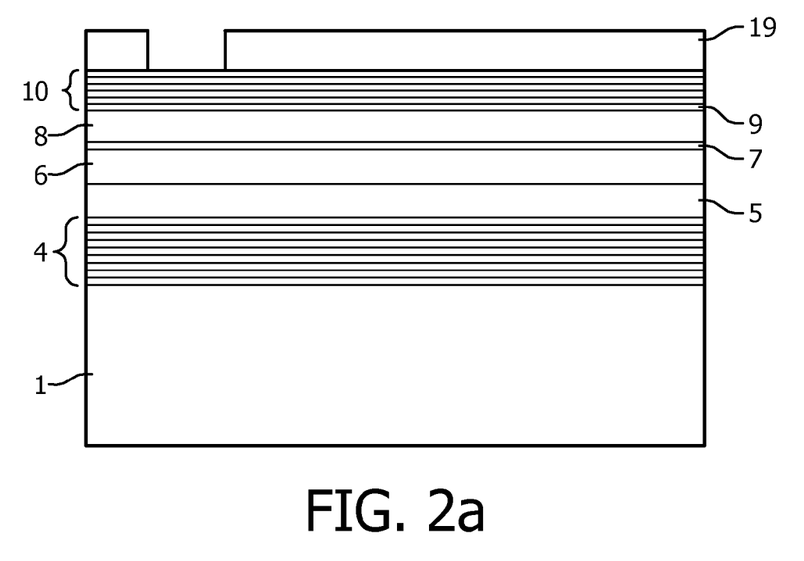
FIG. 2 an example of different steps of processing the layer structure of FIG. 1 to form the proposed VCSEL.
Figure 2B:
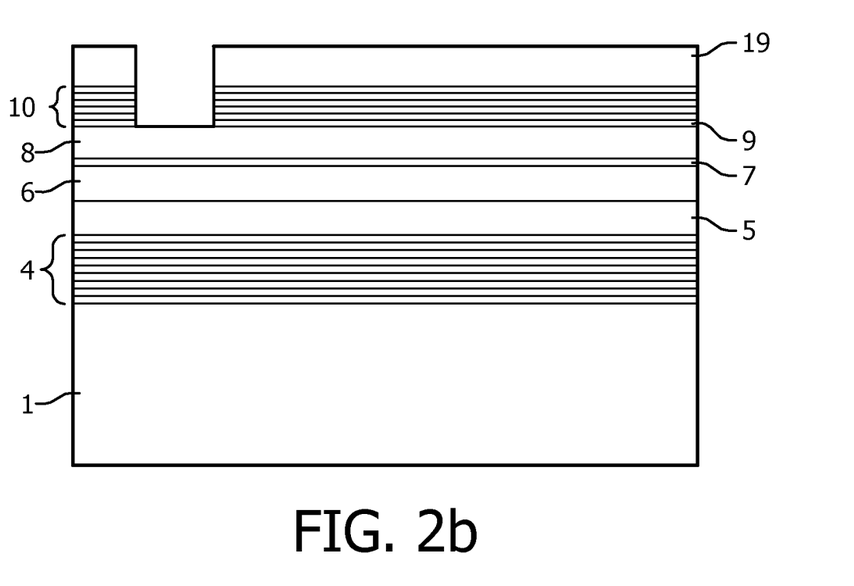
Figure 2C:
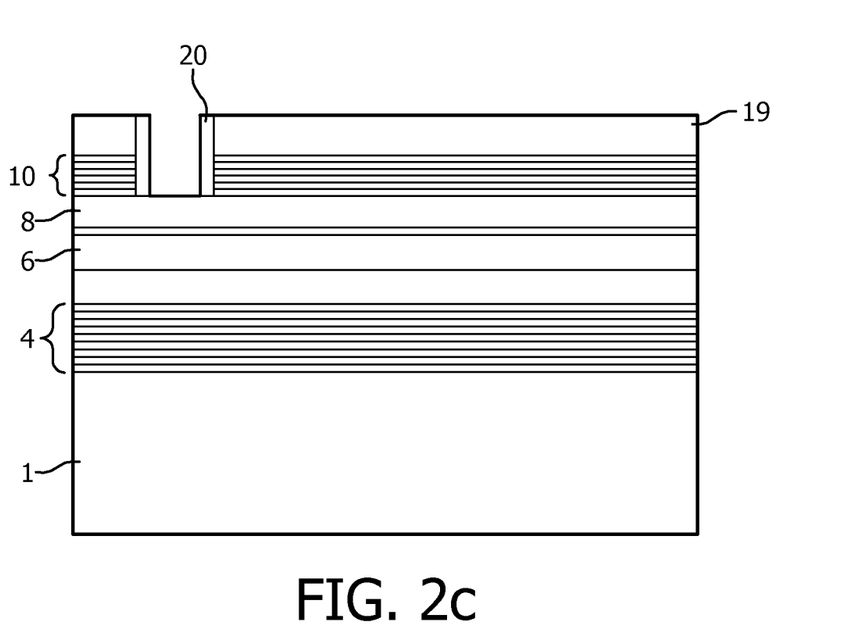
Figure 2D:
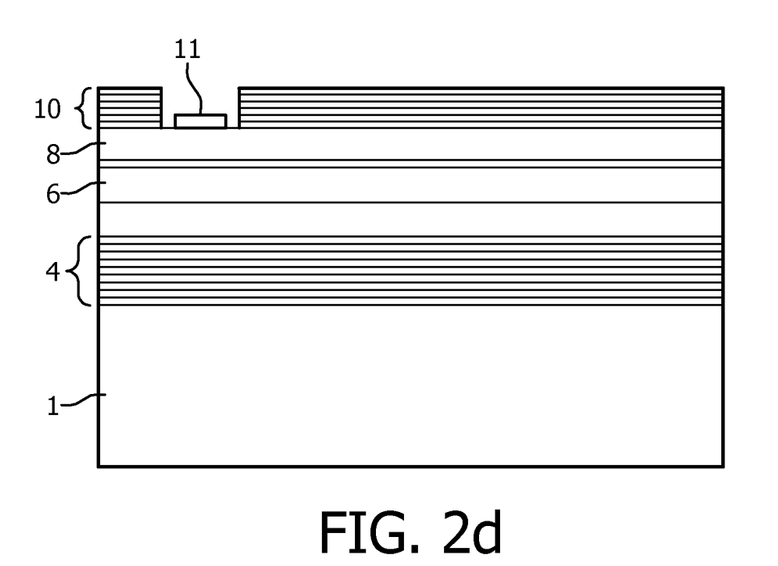

In the processing, a resist 19 is applied to protect the areas where the outcoupling mirrors (top DBRs 10) of the individual VCSELs will be located (FIG. 2a). Then a selective wet etching step of each individual layer is performed down to the etch stop layer 9 (FIG. 2b) in order to allow applying a metallic contact to the upper region of the p-current-injection layer 8. A resist 20 for p-contact lift-off is applied (FIG. 2c) and p-contact evaporation and lift-off are performed resulting in the desired metallic p-contact 11 for the individual VCSELs (FIG. 2d). In FIG. 2, only one of these VCSELs is shown.

Figure 2E:
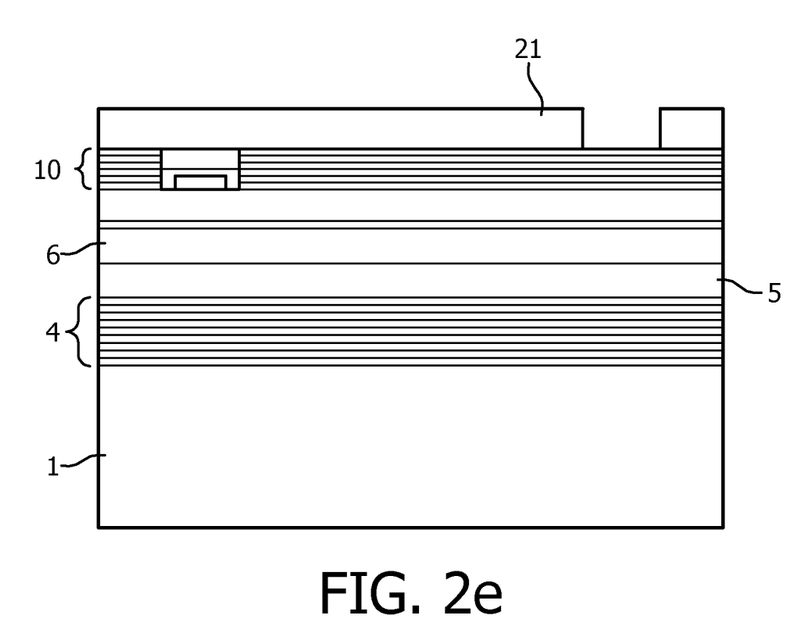
Figure 2F:
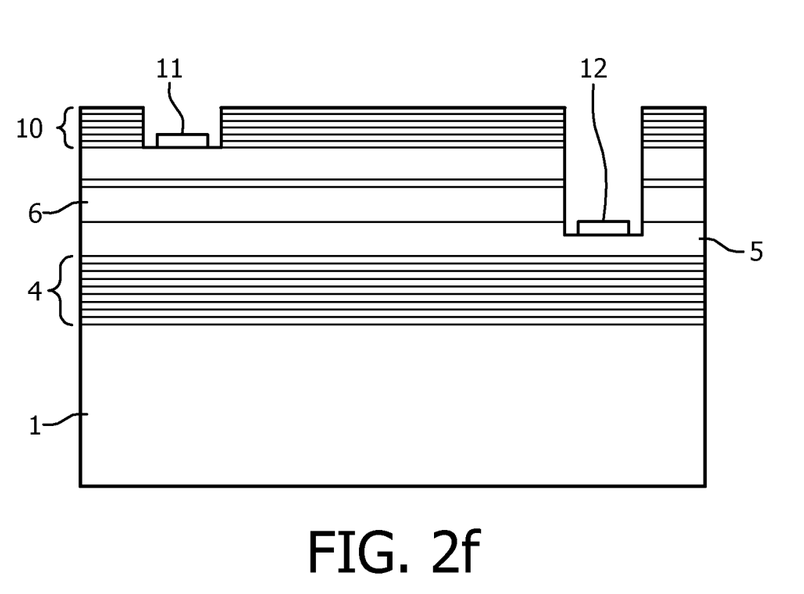

A resist mask 21 for wet etching into the n-doped current-injection layer 5 and for n-contact lift-off is applied (FIG. 2e). This step is followed by the n-contact evaporation and lift-off, in order to apply the required n-contact 12 for electrically contacting the n-current-injection layer 5 (FIG. 2f).

Figure 2G:
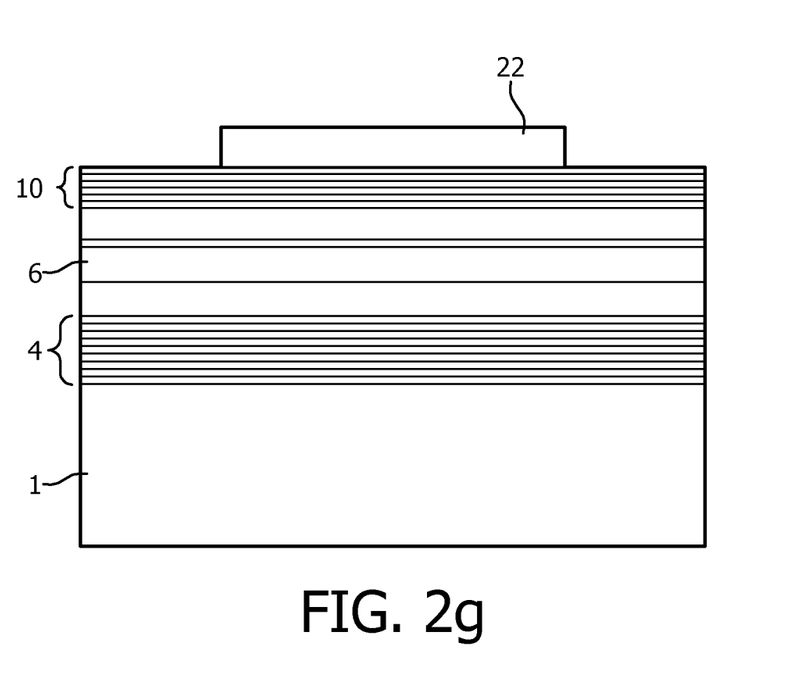
Figure 2H:
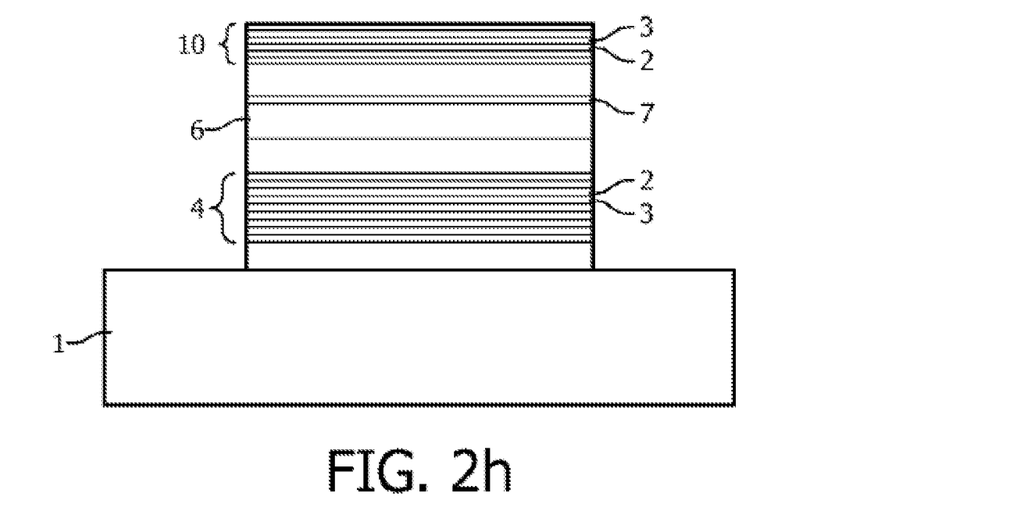
Figure 2I:
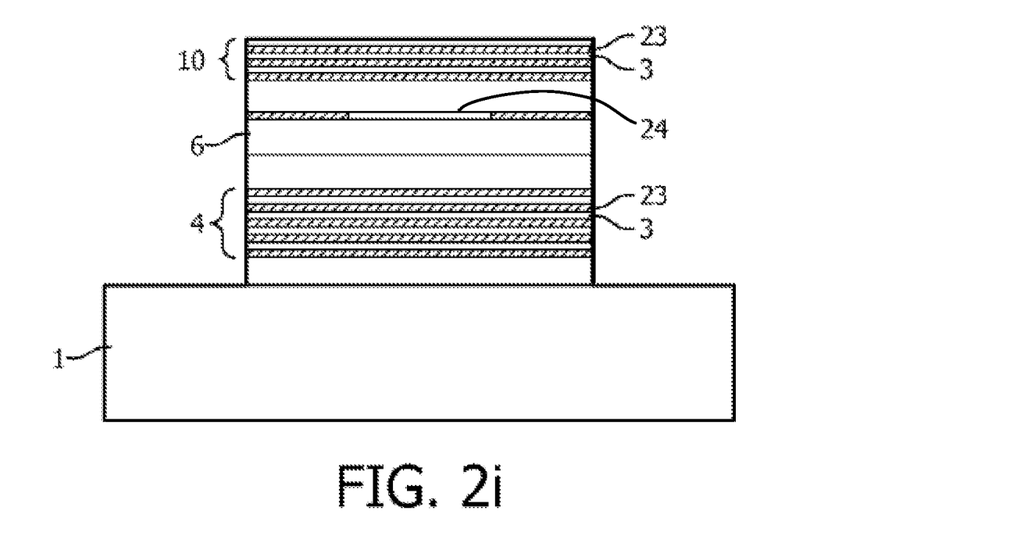

After this step, a resist 22 for dry etching is applied to the structure (FIG. 2g). FIGS. 2g to 2i show a cross section of the layer sequence perpendicular to the cross section shown in FIGS. 2a to 2f. The resist defines the regions in which the complete layer sequence is etched down to the substrate 1. This design is selected such that the desired form of the current aperture can be achieved in a oxidation step. On the other hand, the portions of the layer structure connecting the active region with the n- and p-contacts must be sufficiently thin to allow a full oxidation of the DBR AlAs layers 2 in this portion. After application of the resist dry etching is performed through all epitaxial layers, so that all AlAs-layers 2, 7 to be oxidized are just now exposed to the outside (FIG. 2h). In the subsequent oxidation process all of the AlAs-layers 2 in the DBR mirrors and the AlAs-layer 7 for the current aperture are oxidized (FIG. 2i). Since the AlAs-layer 7 of the current aperture is approximately 20 nm thick only and the AlAs-layers 2 of the DBRs are >100 nm thick, the oxidation rate of the current aperture is less than the oxidation rate of the AlAs in the DBRs, the desired current aperture 24 can be achieved with the oxidation step whereas the AlAs layers 2 of the DBRs are completely oxidized in the same step resulting in the desired Aluminum oxide layers 23. During the oxidation step at high temperature the n-contact 12 alloys and thus a low ohmic contact is achieved between the n-contact 12 and the n-current-injection layer 5 on the n-side.

The VCSELs are now ready for on-wafer-characterization. If the chips should come into a product, passivation, bondpad process, wafer thinning and dicing would need to be added. This is quite similar to conventional VCSEL fabrication and thus not further described here.

Figure 3:
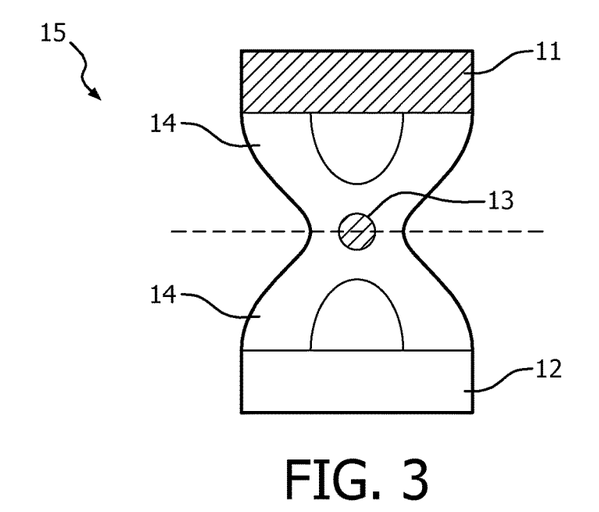
FIG. 3 a top view of an example of a layout of the proposed VCSEL.

FIG. 3 shows an exemplary layout of such a VCSEL 15 (top view) processed as described above. The dashed line indicates the line of the cross section shown in FIGS. 2g to 2i. In this layout the light emitting area 13 is encircled by oxidation coming from four sides. These four sides are provided by the dry etching process through all of the epitaxial layers. As already described above, this etching is performed to allow achieving the desired current aperture. For example, in case of a circular current aperture the distance to the optical axis of the laser from all sides after etching is approximately equal. The figure also shows the p-contact 11 and the n-contact 12 arranged on opposing sides of the VCSEL. There are four non-etched bars 14 of the epitaxial layer structure to pass the carriers from the contact areas to the center region of the laser. To avoid leakage current, the width of the bars should not be more than two times the oxidation width of the light emitting area 13, as shown in the figure. It is obvious for the skilled person that this design is only one possibility for such a VCSEL. Instead of two bars for connection between the n- or p-contacts and the central region of the VCSEL also one or more than two such bars can be realized.

Figure 4:
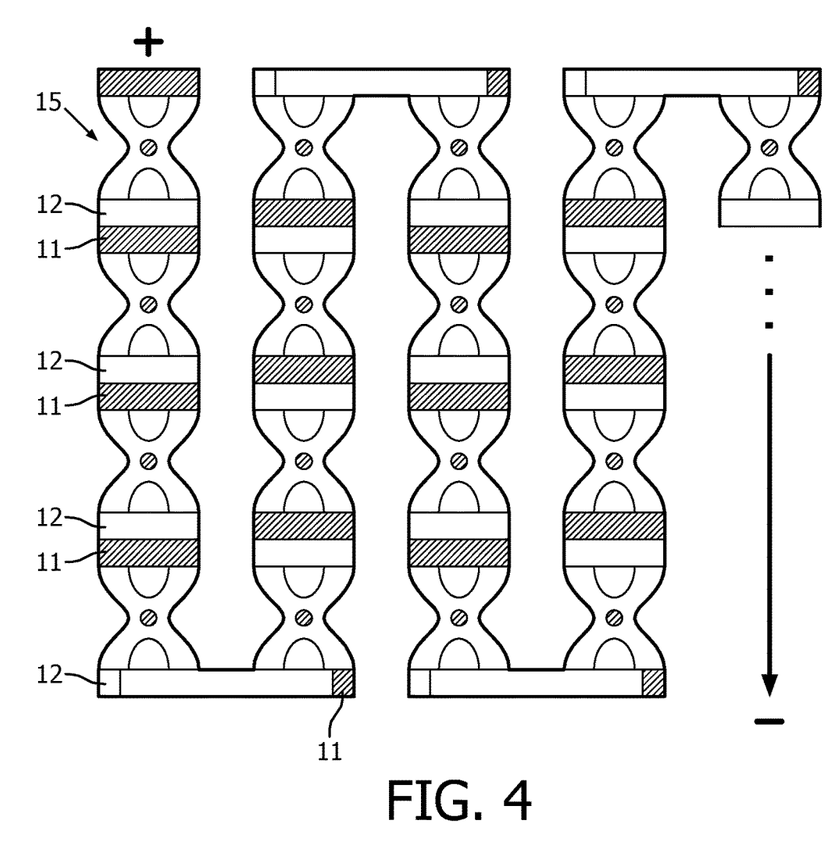
FIG. 4 an example of a series connection of proposed VCSELs on a single monolithic chip.

In typical operation conditions, each single VCSEL has approximately 2V. In order to operate a VCSEL device with 230V, a layout must be provided with 230/2 VCSELs in series to be compatible with 230V. The fabrication process of such a device can be similar as already described above for single VCSELs. Now the cathode of each individual VCSEL needs to be connected with the anode of the corresponding adjacent VCSEL. Since the cathodes are not connected by a common semiconductor layer in the proposed design, the serial connection can be realized by just adapting the layout as shown in FIG. 4. This figure shows several VCSELs 15 connected in series within a single monolithic chip (not shown). In this layout the cathode of a VCSEL faces or overlaps with the anode of the adjacent VCSEL in each row. Adjacent rows are then also connected with their contacts accordingly in order to achieve a total series of 115 single VCSELs in this example.

Figure 5A:
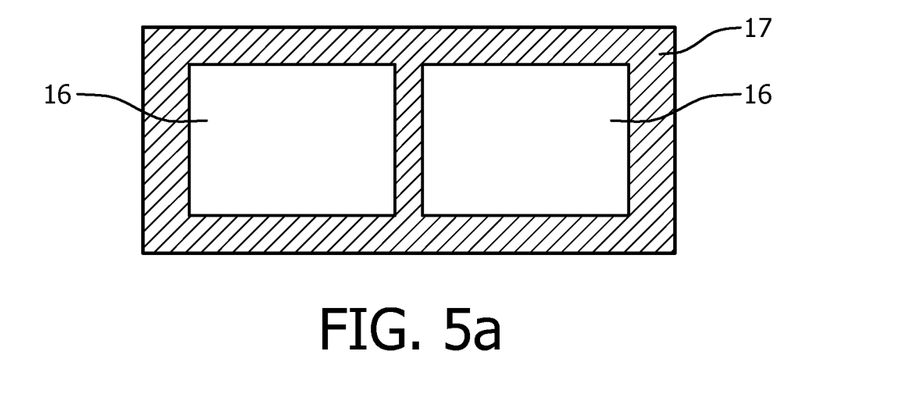
FIG. 5 a top, a side and a bottom view of an example of a SMD-like package of a VCSEL array according to the present invention.

It is obvious that the proposed VCSELs can be realized as bottom emitters as well. In such a configuration, each VCSEL may be located closer to a heat sink or at least closer to a material with less thermal resistance than a GaAs substrate. All contacts can be accessed from the epi side, i.e. from the side of the upper most layer of the epitaxial layer sequence grown on the GaAs substrate. This means that a set of passivation and metallization steps can be used to separate anode and cathode contacts to the left/right side of a VCSEL array. A thick copper plating 16—having a thickness of 100 μm in this example—and forming anode and cathode, together with a thick passivation process, for example a SU8 resist, can be used to ensure mechanical stability within the VCSEL array. The bottom emitters are separated by means of a wet-chemical epitaxial lift-off technology from the GaAs substrate which is possible just by having one more Aluminum oxide layer between the bottom DBR and the substrate for this purpose. The final VCSEL array is shown in FIG. 5. In the top view (epi side) of FIG. 5a the passivation layer 17 and the copper plating 16 for the anode and cathode can be recognized. The whole chip in this example has a dimension of 1 mm×2 mm and a thickness of approx. 100 μm, and is thus useable as a SMD device.

Figure 5B:
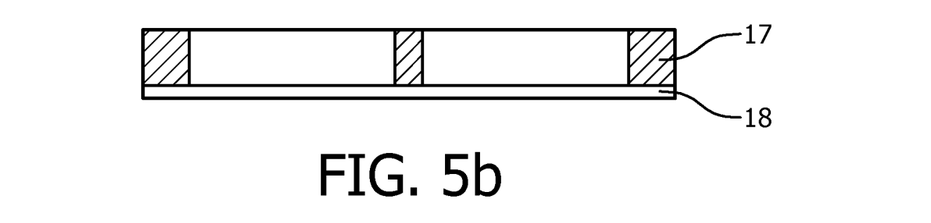
Figure 5C:
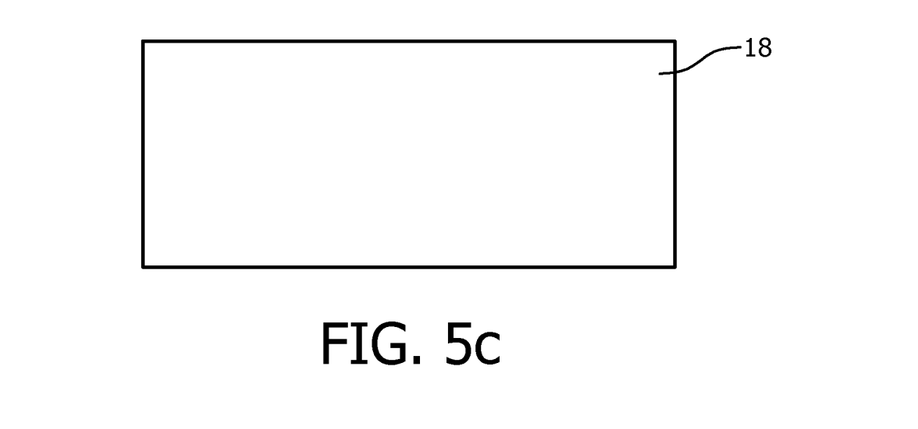

The thick passivation layer 17 and the thick copper plating 16 are also shown in the side view of FIG. 5b on top of the thin VCSEL layer structure 18. In the bottom view of FIG. 5c after epitaxial lift-off of the substrate a view on the bottom side of the layer structure 18 is shown containing thousands of VCSELs side by side (not shown) emitting through the planar GaAs-layer at the bottom side. Less than 10% of such a chip are formed of Arsenic compounds which improves the environmental safety of such a VCSEL device.

While the invention has been illustrated and described in detail in the drawings and forgoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. The features of all claims of the device can be freely combined. Any reference signs in the claims should not be construed as limiting the scope of the invention.

LIST OF REFERENCE SIGNS

1 GaAs-substrate
2 AlAs-layer of DBR
3 GaAs-layer of DBR
4 bottom DBR
5 n-current-injection layer
6 active region
7 AlAs-layer for current aperture
8 p-current-injection layer
9 etch stop layer
10 top DBR
11 p-contact
12 n-contact
13 light emitting area
14 non-etched bars
15 VCSEL
16 copper plating
17 passivation layer
18 VCSEL layer structure
19 resist
20 resist for p-contact lift-off
21 resist mask
22 resist for dry etching
23 Aluminum oxide layer of DBR
24 current aperture

The invention claimed is:

1. A laser device comprising at least one vertical cavity surface emitting laser with intracavity contacts, the vertical cavity surface emitting laser having at least two sides that are substantially parallel to an optical axis of the vertical cavity surface emitting laser, the vertical cavity surface emitting laser comprising:
 an epitaxial layer structure with an active region, the active region having a first surface that emits light toward a first distributed Bragg reflector and a second surface that emits light toward a second distributed Bragg reflector, the epitaxial layer structure comprising discrete layers, comprising:
  a first current-injection layer of a first conductivity type between the first distributed Bragg reflector and the first surface of the active region,
  a second current-injection layer of a second conductivity type between the second distributed Bragg reflector and the second surface of the active region, and
  a current aperture layer between the active region and the second current-injection layer, the current aperture layer including an oxidized region and an unoxidized region, the unoxidized region enabling charge carriers to flow between the second current-injection layer and the active region,
 at least four bars formed by etching the epitaxial layer structure and configured to provide current to the first and second current-injection layers,
 a first metal contact in electrical contact with the first current-injection layer using at least a first of the four bars, and
 a second metal contact in electrical contact with the second current-injection layer using at least a second of the four bars,
 wherein said first and/or second distributed Bragg reflectors are formed of alternating Aluminum oxide layers and $Al(x)Ga(1-x)As$ layers wherein $0 \leq x \leq 0.3$,
 wherein the first metallic contact is disposed on a first side of the at least two sides and the second metallic contact is disposed on a second side, opposite the first side of the laser device, and
 wherein a width of each of the at least four bars is equal to or less than two times a width of the unoxidized region of the current aperture layer.

2. The laser device according to claim 1, wherein said first current-injection layer is a n-doped semiconductor layer and said second current-injection layer is a p-doped semiconductor layer.

3. The laser device according to claim 1, wherein a doping concentration of said first and/or second current-injection layer varies in a direction of the optical axis of the laser to form several higher doped regions of the first conductivity type between lower doped regions or regions without doping, the higher doped regions being arranged in minima of a standing electrical field forming between the first and the second distributed Bragg reflector during laser operation.

4. The laser device according to claim 1, wherein said epitaxial layer structure is arranged on a substrate.

5. The laser device according to claim 4, wherein several of said vertical cavity surface emitting lasers are arranged side by side on the substrate and electrically connect in series on said substrate.

6. The laser device according to claim 5, wherein at least one group of the lasers are arranged such that the first metallic contacts of the lasers of said group face the second metallic contacts of adjacent lasers of said group.

7. The laser according to claim 1, wherein several of said vertical cavity surface emitting lasers are arranged side by side and electrically connected to a metallization structure which is applied on a side opposing an outcoupling side of the lasers, said metallization structure being designed to have a thickness suitable for mechanically supporting the lasers without a substrate.

8. The laser according to claim 7, wherein the metallization structure forms contact pads for electrically contacting the lasers.

9. The laser according to claim 1,
 wherein one of said first and second distributed Bragg reflectors comprises less than 10 pairs of Aluminum oxide and $Al(x)Ga(1-x)As$ containing layers, and
 wherein the other of the first and second distributed Bragg reflectors comprises less than 5 pairs of Aluminum oxide and $Al(x)Ga(1-x)As$ containing layers.

10. A laser device comprising at least one vertical cavity surface emitting laser with intracavity contacts the vertical cavity surface emitting laser having at least two sides that are substantially parallel to an optical axis of the vertical cavity surface emitting laser, the vertical cavity surface emitting laser comprising:
 an epitaxial layer structure with an active layer, the active layer having a first surface that emits light toward a first distributed Bragg reflector and a second surface that emits light toward a second distributed Bragg reflector, the epitaxial structure comprising discrete layers, comprising:
  a first semiconductor layer of a first conductivity type between the first distributed Bragg reflector and the first surface of the active layer,
  a second semiconductor layer of a second conductivity type between the second distributed Bragg reflector and the second surface of the active layer, and
  a third semiconductor layer between the second surface of the active layer and the second semiconductor layer, the third layer including a non-conducting region and a conduction region, the conduction region enabling charge carriers to flow between the second semiconductor layer and the active layer, at least four bars formed by etching the epitaxial layer structure and configured to provide current to the first and second current-injection layers, a first metal contact in electrical contact with the first semiconductor layer via at least a first of the four bars, and a second metal contact in electrical contact with the second semiconductor layer via at least a second of the four bars, wherein said first and/or second distributed Bragg reflectors are formed of alternating Aluminum oxide layers and $Al(x)Ga(1-x)As$ layers wherein $0 \leq x \leq 0.3$, wherein the first metallic contact is situated at a first side of the at least two sides of the laser device and the second metallic contact is situated at a second side of the at least two sides of the laser device, opposite the first extremity, and wherein a width of each of the at least four bars is equal to or less than two times a width of the conductive region of the third semiconductor layer.

* * * * *